(12) United States Patent
Zhou

(10) Patent No.: US 11,386,956 B2
(45) Date of Patent: Jul. 12, 2022

(54) MECHANISM AND OPTICAL SYSTEM FOR OPTICAL-MEDIUM STORAGE

(71) Applicant: ZHENGZHOU YUNHAI INFORMATION TECHNOLOGY CO., LTD., Henan (CN)

(72) Inventor: Dong Zhou, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 337 days.

(21) Appl. No.: 16/493,261

(22) PCT Filed: Oct. 26, 2018

(86) PCT No.: PCT/CN2018/111999
§ 371 (c)(1),
(2) Date: Sep. 11, 2019

(87) PCT Pub. No.: WO2019/192164
PCT Pub. Date: Oct. 10, 2019

(65) Prior Publication Data
US 2021/0327506 A1  Oct. 21, 2021

(30) Foreign Application Priority Data
Apr. 2, 2018 (CN) .......................... 201810284557.0

(51) Int. Cl.
*G11C 13/04* (2006.01)
(52) U.S. Cl.
CPC .................................. *G11C 13/048* (2013.01)
(58) Field of Classification Search
CPC .............................. G11C 13/048; G11C 13/04
(Continued)

(56) References Cited

U.S. PATENT DOCUMENTS

| 5,537,379 | A | 7/1996 | Kimura et al. |
| 7,689,894 | B2 * | 3/2010 | Hsueh .................... G11B 20/18 714/785 |

(Continued)

FOREIGN PATENT DOCUMENTS

| CN | 1467680 A | 1/2004 |
| CN | 1516064 A | 7/2004 |

(Continued)

OTHER PUBLICATIONS

International Search Report for PCT/CN2018/111999 dated Jan. 29, 2019, ISA/CN.

(Continued)

*Primary Examiner* — Muna A Techane
(74) *Attorney, Agent, or Firm* — Yue (Robert) Xu; Apex Attorneys at Law, LLP

(57) ABSTRACT

An optical mechanism and an optical system for optical-medium storage. The mechanism includes an optical-medium storage device, and an optical-medium transmission device. The optical-medium storage device is provided with an optical-medium storage module, configured to store an optical medium, and an optical-medium input-output end, configured to receive and transmit the optical medium to the optical-medium storage module and read data from the optical-medium storage module. The optical-medium receiving module is configured to receive the optical medium transmitted from outside and transmit the optical medium to the optical-medium storage module via the optical-medium input-output end, according to a receiving instruction. The optical-medium storing module is configured to form a storage path for the optical medium with the optical-medium storage module. The optical-medium reading module is configured to provide an interface for reading (Continued)

and read the optical medium stored in the optical-medium storage module, according to a reading instruction.

12 Claims, 2 Drawing Sheets

(58) Field of Classification Search
 USPC .......................................................... 365/106
 See application file for complete search history.

(56) References Cited

U.S. PATENT DOCUMENTS

| | | |
|---|---|---|
| 2007/0266299 A1 | 11/2007 | Ching-Wen |
| 2008/0165595 A1 | 7/2008 | Lam |
| 2008/0285393 A1 | 11/2008 | Huang et al. |
| 2009/0268573 A1 | 10/2009 | Chen et al. |
| 2009/0274026 A1 | 11/2009 | Kadowaki et al. |
| 2010/0322045 A1 | 12/2010 | Ma |
| 2011/0222387 A1 | 9/2011 | Ham |
| 2013/0088948 A1 | 4/2013 | Kayama et al. |
| 2014/0089764 A1 | 3/2014 | Goldman et al. |
| 2015/0186328 A1* | 7/2015 | Bonen ................. G11C 29/022 710/105 |
| 2020/0004652 A1* | 1/2020 | Niu ....................... G06F 3/0635 |

FOREIGN PATENT DOCUMENTS

| | | |
|---|---|---|
| CN | 101071604 A | 11/2007 |
| CN | 101089896 A | 12/2007 |
| CN | 101217057 A | 7/2008 |
| CN | 101295529 A | 10/2008 |
| CN | 101308672 A | 11/2008 |
| CN | 101930772 A | 12/2010 |
| CN | 102194487 A | 9/2011 |
| CN | 104205235 A | 12/2014 |
| CN | 108511017 A | 9/2018 |
| EP | 0583416 A4 | 7/1995 |

OTHER PUBLICATIONS

The 1st Office Action regarding Chinese Patent Application No. CN201810284557.0, dated Feb. 8, 2021. English Translation Provided.

* cited by examiner

MECHANISM AND OPTICAL SYSTEM FOR OPTICAL-MEDIUM STORAGE

This application is the national phase of International Application No. PCT/CN2018/111999, titled "OPTICAL MECHANISM AND OPTICAL SYSTEM FOR OPTICAL-MEDIUM STORAGE", filed on Oct. 26, 2018, which claims the priority to Chinese Patent Application No. 201810284557.0, titled "OPTICAL MECHANISM AND OPTICAL SYSTEM FOR OPTICAL-MEDIUM STORAGE", filed on Apr. 2, 2018 with the China National Intellectual Property Administration, which is incorporated herein by reference in its entirety.

FIELD

The present disclosure relates to the field of optical-medium transmission, and particularly, to a mechanism and a system for optical medium storage.

BACKGROUND

With progress and development of science and technology, a role of information in society is increasingly valued by people. Increasing amount of information prompts development of mass storage devices, so as to achieve fast storage.

Electronic chips serve as a medium for most conventional storage devices. Performances of the electronic chip are limited by heat and resistance from electron collisions, thereby affecting a transmission speed and relying deeply on electromagnetic metal materials.

SUMMARY

In order to address drawbacks in the aforementioned conventional technology, a mechanism for optical-medium storage is provided according to an embodiment of the present disclosure, including an optical-medium storage device, and an optical-medium transmission device, where:

the optical-medium storage device is provided with an optical-medium storage module and an optical-medium input-output end, the optical-medium storage module is configured to store an optical medium, and the optical-medium input-output end is configured to receive and transmit the optical medium to the optical-medium storage module and read data in the optical medium stored in the optical-medium storage module;

the optical-medium transmission device is arranged at the optical-medium input-output end, the optical-medium transmission device includes an optical-medium receiving module, an optical-medium storing module, and an optical-medium reading module;

the optical-medium receiving module is configured to receive the optical medium transmitted from outside and transmit the optical medium to the optical-medium storage module via the optical-medium input-output end, according to a receiving instruction;

the optical-medium storing module is configured to cooperate with the optical-medium storage module, and form a storage path for the optical medium with the optical-medium storage module; and the optical-medium reading module is configured to provide an interface for reading and read the optical medium stored in the optical-medium storage module, according to a reading instruction.

An optical system for optical-medium storage, including: multiple mechanisms for optical-medium storage, an encoding module for the multiple mechanisms for optical-medium storage, a switching instruction acquisition module, and a switching instruction execution module;

the encoding module is configured to encode each of the multiple mechanisms for optical-medium storage, to allocate a unique code to each of the multiple mechanisms for optical-medium storage in the optical system;

the switching instruction acquisition module is configured to acquire a switching instruction inputted by a user, where the switching instruction includes: a switching instruction for receiving an optical medium that includes the unique code of one of the multiple mechanisms, a switching instruction for reading an optical medium that includes the unique code of one of the multiple mechanisms, or a switching instruction for storing an optical medium that includes the unique code of one of the multiple mechanisms; and the switching instruction execution module is configured to send a switching operation instruction, according to the switching instruction acquired by the switching instruction acquisition module, to an instruction acquisition module of the one of the multiple mechanisms for optical-medium storage that corresponds to the unique code included in the switching instruction.

Based on the above technical solutions, the present disclosure has the following advantages.

The data in the optical medium is stored in the optical-medium storage module, the optical-medium receiving module achieves a receiving function for the optical-medium storage module, the optical-medium storing module achieves a function of being integrated with the optical-medium storage module, and the optical-medium reading module achieves a function of reading the data in the optical medium inside the optical-medium storage module for an external device. Thereby, light serves as a storage medium, reducing power consumption, saving energy, and increasing a storage speed. Moreover, three states of reading, receiving and storing can be switched on requirement of a user or a system, so that the optical-medium storage module has a function of being coordinated by the user or the system.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION

To make the object, technical solutions and advantages of the present application clearer, the technical solutions according to the embodiments of the present application will be described clearly and completely as follows in conjunction with the drawings in the embodiments of the present application. It is apparent that the described embodiments are only a part of the embodiments according to the present application, rather than all the embodiments. Any other embodiments obtained by those skilled in the art based on the embodiments in the present application without any creative efforts fall within the protection scope of the present application.

First Embodiment

Figure 1:
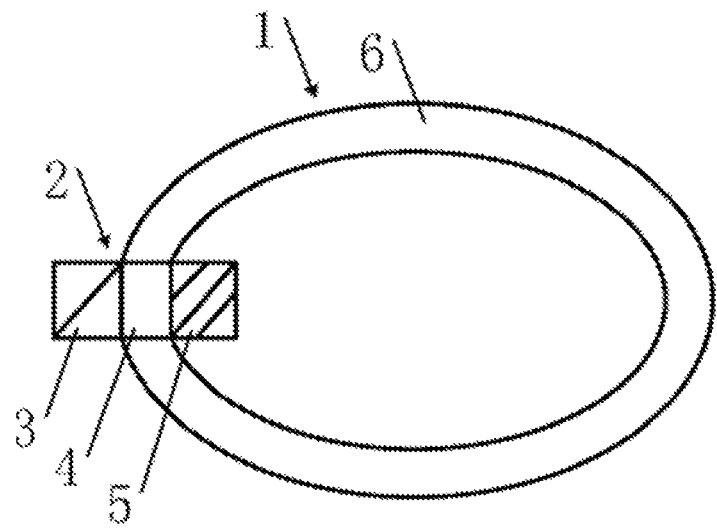
FIG. 1 is a schematic diagram of a real-time state of a mechanism for optical-medium storage.
Figure 2:
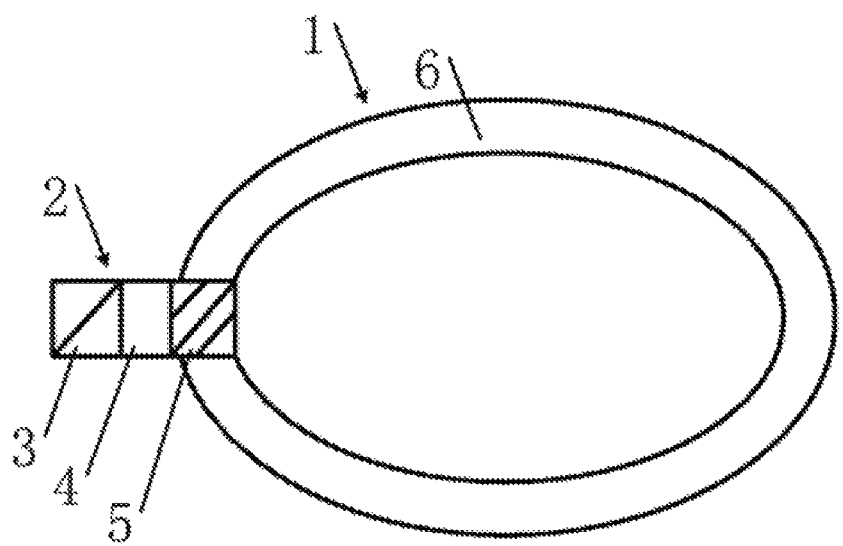
FIG. 2 is a schematic diagram of another real-time state of a mechanism for optical-medium storage.
Figure 3:
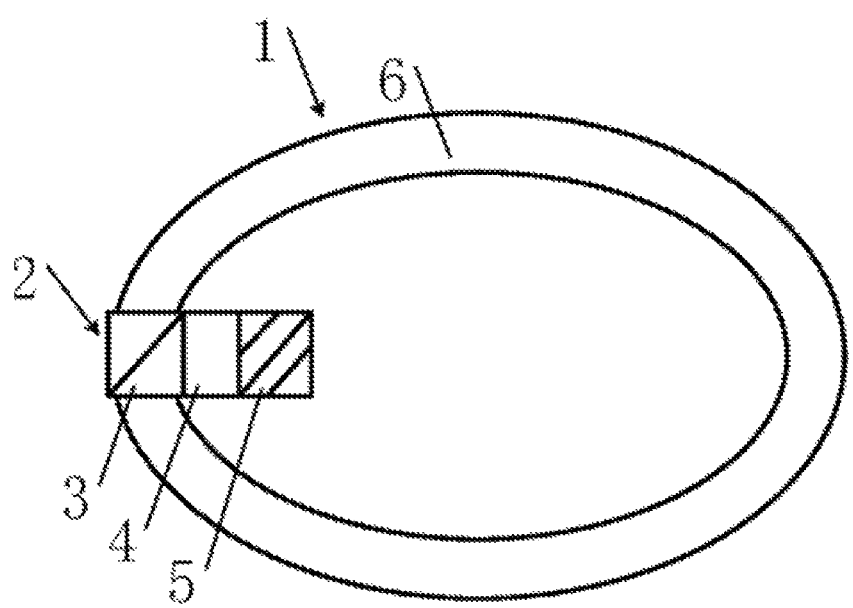
FIG. 3 is a schematic diagram of another real-time state of a mechanism for optical-medium storage.

A mechanism for optical-medium storage is provided according to an embodiment of the present disclosure, as illustrated in FIGS. 1 to 3. The mechanism for optical-medium storage includes an optical-medium storage device 1 and an optical-medium transmission device 2.

The optical-medium storage device 1 is provided with an optical-medium storage module and an optical-medium input-output end. The optical-medium storage module is configured to store an optical medium. The optical-medium input-output end is configured to receive and transmit the optical medium to the optical-medium storage module 6, and read data in the optical medium stored in the optical-medium storage module 6.

It should be understood that the optical-medium storage module 6 is an apparatus for storing the data that is in the optical-medium. The optical-medium input-output end is an input-output end for the data in the optical medium of the optical-medium storage module 6. The optical-medium input-output end enables the data in the optical medium inside the optical-medium storage module 6 to be outputted or inputted.

The optical-medium transmission device 2 is arranged at the optical-medium input-output end. The optical-medium transmission device 2 includes an optical-medium receiving module 3, an optical-medium storing module 4, and an optical-medium reading module 5. The optical-medium receiving module 3 is configured to receive the optical medium transmitted from outside and transmit the optical medium to the optical-medium storage module 6 via the optical-medium input-output end, according to a receiving instruction.

Input or acquisition of the data in the optical medium for the optical-medium storage module 6 is implemented by the optical-medium receiving module 3. Output of the data in the optical medium for the optical-medium storage module 6 is implemented by the optical-medium reading module 5. The optical-medium storing module 4 and the optical-medium storage module 6 can form integrity.

The optical-medium storing module 4 is configured to cooperate with the optical-medium storage module 6, and form a storage path for the optical medium with the optical-medium storage module 6. The optical-medium reading module 5 is configured to provide an interface for reading, and read the optical medium stored in the optical-medium storage module 6, according to a reading instruction.

Switching among the optical-medium receiving module 3, the optical-medium storing module 4, and the optical-medium reading module 5 may be performed and set by a user, or may be performed by a control apparatus arranged in the mechanism for optical-medium storage.

Second Embodiment

This embodiment is basically same as the first embodiment, and differs in that the optical-medium transmission device 2 further includes a module switching device and an instruction acquisition module.

The instruction acquisition module is configured to acquire an instruction for receiving the data in the optical medium, an instruction for transmitting the data in the optical medium, or an instruction for storing the data in the optical medium. The module switching device is configured to switch the optical-medium receiving module 3 to cooperate with the optical-medium input-output end in response to the instruction acquisition module acquiring the instruction for receiving the data in the optical medium, so that the optical-medium storage module receives the data in the optical medium via the optical-medium receiving module. The module switching device is further configured to switch the optical-medium reading module 5 to cooperate with the optical-medium input-output end in response to the instruction acquisition module acquiring the instruction for transmitting the data in the optical medium, so that the optical-medium storage module transmits the data in the optical medium via the optical-medium reading module 5. The module switching device is further configured to switch the optical-medium storing module 4 to cooperate with the optical medium input-output end in response to the instruction acquisition module acquiring the instruction for storing the data in the optical medium, so that the optical medium storing module 4 form a storage path for the optical medium with the optical-medium storage module 6.

A main function of the instruction acquisition module is to acquire the instruction for operation, which is inputted from outside, such as the instruction for operation that is inputted by the user or by the system. The instruction for operation includes a switching instruction for receiving the optical medium, a switching instruction for reading the optical medium, and a switching instruction for storing the optical medium. A module switching apparatus executes corresponding switching instructions.

Third Embodiment

This embodiment is basically same as the second embodiment, and differs in that the optical-medium receiving module 3 includes a receiving interface, a receiving reflector and a receiving transmitter. The receiving interface is connected to an external interface, and the receiving reflector is configured to reflect the data in the optical medium, which is received by the receiving interface, to the receiving transmitter. The receiving transmitter is connected to the optical-medium input-output end, and is configured to send the data in the optical medium reflected by the receiving reflector to the optical-medium storage module 6.

Herein the optical-medium receiving module 3 reflects the received data in the optical medium into the optical-medium storage module 6 for storage.

Fourth Embodiment

This embodiment is basically same as the second embodiment, and differs in that the optical-medium storing module 4 is provided with an optical transmission part. The optical transmission part is configured to cooperate with the optical medium input-output end to transmit the data in the optical medium stored by the optical-medium storage module 6. The optical-medium storing module 4 and the optical-medium storage module 6 form integrity.

Fifth Embodiment

The embodiment is basically same as the second embodiment, and differs in that the optical-medium reading module 5 includes an optical splitter and a reading interface. The optical splitter is configured to split the data in the optical medium of the optical-medium storage module 6 into optical-medium data stored in the optical-medium storage module 6 and read optical-medium data, and send the read optical-medium data to the reading interface. The read interface is configured to transmit the read optical-medium data to an external read interface connected to the reading interface.

The optical-medium reading module 5 splits the data in the optical medium of the optical-medium storage module 6 into the optical-medium data stored in the optical-medium storage module 6 and the read optical-medium data for externally reading. Thereby, the optical-medium storage module 6 still stores the original data in the optical medium, while providing the data in the optical medium to outside.

Sixth Embodiment

This embodiment is basically same as the second embodiment, and differs in that the optical-medium storage module 6 is a torus structure. Multiple reflecting mirrors are arranged inside the torus structure to store the data in the optical medium inside the torus structure in a circulating manner. The data in the optical medium are stored in the circulating manner in the optical-medium storage module 6.

Furthermore, the optical-medium receiving module 3 includes a receiving interface, a receiving reflector and a receiving transmitter. The receiving interface is connected to an external interface, and the receiving reflector is configured to reflect the data in the optical medium, which is received by the receiving interface, to the receiving transmitter. The receiving transmitter is connected to the optical-medium input-output end, and is configured to send the data in the optical medium reflected by the receiving reflector to the optical-medium storage module 6.

The optical-medium storing module 4 is provided with an optical transmission part. The optical transmission part is configured to cooperate with the optical medium input-output end to transmit the data in the optical medium stored by the optical-medium storage module 6.

The optical-medium reading module 5 includes an optical splitter and a reading interface. The optical splitter is configured to split the data in the optical medium of the optical-medium storage module 6 into optical-medium data stored in the optical-medium storage module 6 and read optical-medium data, and send the read optical-medium data to the reading interface. The read interface is configured to transmit the read optical-medium data to an external read interface connected to the reading interface.

Using optical-medium to store data does not consume electric power, thereby reducing energy consumption. There are problems such as heat generation in electronic signal storage devices, which affects reading and storing efficiency of such devices. Therefore, using an optical-medium to store data achieves a higher storage speed than using an electrical signal.

Since an optical fiber may be very thin and has a small overall volume, it is necessary to prepare an optical fiber that is long enough to store optical data and fix the optical fiber. Light is circulated in the closed fiber to achieve optical storage, and a beam splitter splits a beam of light into two beams to achieve repeated reading of an optical signal.

A system for optical-medium storage is further provided according to the present disclosure. The system includes multiple ones of the mechanism for optical-medium storage, an encoding module for the multiple mechanisms for optical-medium storage, a switching instruction acquisition module, and a switching instruction execution module. The encoding module is configured to encode each of the multiple mechanisms for optical-medium storage, to allocate a unique code to each of the multiple mechanisms for optical-medium storage in the optical system. The switching instruction acquisition module is configured to acquire a switching instruction inputted by a user. The switching instruction includes a switching instruction for receiving the optical medium that includes the unique code of one of the multiple mechanisms, a switching instruction for reading the optical medium that includes the unique code of one of the multiple mechanisms, or a switching instruction for storing the optical medium that includes the unique code of one of the multiple mechanisms. The switching instruction execution module is configured to send a switching operation instruction, according to the switching instruction acquired by the switching instruction acquisition module, to an instruction acquisition module of the one of the multiple mechanisms for optical-medium storage that corresponds to the unique code included in the switching instruction.

In such case, the system can realize simultaneous operation of the multiple mechanisms for optical-medium storage. A data storage capacity of the system is ensured, and storage and operation efficiency of the system are improved. The user can find stored information of a corresponding mechanism for optical-medium storage according to the code, and control storage of each mechanism for optical-medium storage based on the code.

The embodiments of the present disclosure are described in a progressive manner, and each embodiment places emphasis on the difference from other embodiments. Therefore, one embodiment can refer to other embodiments for the same or similar parts.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but confirms to a widest scope in accordance with principles and novel features disclosed in the present disclosure.

The invention claimed is:

1. A mechanism for optical-medium storage, comprising an optical-medium storage device and an optical-medium transmission device, wherein:
    the optical-medium storage device comprises an optical-medium storage module and an optical-medium input-output end, the optical-medium storage module is configured to store an optical data, and the optical-medium input-output end is configured to receive and transmit the optical data to the optical-medium storage module and read the optical data stored in the optical-medium storage module;
    the optical-medium transmission device is arranged at the optical-medium input-output end, the optical-medium transmission device comprises an optical-medium receiving module, an optical-medium storing module, and an optical-medium reading module;
    the optical-medium receiving module is configured to receive the optical data transmitted from outside and transmit the optical data to the optical-medium storage module via the optical-medium input-output end, according to a receiving instruction;

the optical-medium storing module is configured to cooperate with the optical-medium storage module, and form a storage path for the optical data with the optical-medium storage module; and the optical-medium reading module is configured to provide an interface for reading and read the optical data stored in the optical-medium storage module, according to a reading instruction;

wherein the optical-medium transmission device further comprises a module switching device and an instruction acquisition module;

the optical-medium transmission device further comprises a module switching device and an instruction acquisition module;

the instruction acquisition module is configured to acquire an instruction for receiving the optical data, an instruction for transmitting the optical data, or an instruction for storing the optical data; and the module switching device is configured to:
 switch the optical-medium receiving module to cooperate with the optical-medium input-output end in response to the instruction acquisition module acquiring the instruction for receiving the optical data, so that the optical-medium storage module receives the optical data via the optical-medium receiving module;
 switch the optical-medium reading module to cooperate with the optical-medium input-output end in response to the instruction acquisition module acquiring the instruction for transmitting the optical data, so that the optical-medium storage module transmits the optical data via the optical-medium reading module; and
 switch the optical-medium storing module to cooperate with the optical-medium input-output end in response to the instruction acquisition module acquiring the instruction for storing the optical data, so that the optical-medium storing module form the storage path for the optical data with the optical-medium storage module.

2. The mechanism for optical-medium storage according to claim 1, wherein, the optical-medium receiving module comprises a receiving interface, a receiving reflector and a receiving transmitter, wherein:
 the receiving interface is connected to an external interface;
 the receiving reflector is configured to reflect light carrying the optical data, which is received by the receiving interface, to the receiving transmitter; and
 the receiving transmitter is connected to the optical-medium input-output end, and is configured to transmit the light carrying the optical data, which is reflected by the receiving reflector, to the optical-medium storage module.

3. The mechanism for optical-medium storage according to claim 1, wherein, the optical-medium storing module comprises an optical transmission part, and the optical transmission part is configured to cooperate with the optical-medium input-output end to transmit the optical data.

4. The mechanism for optical-medium storage according to claim 1, wherein:
 the optical-medium reading module comprises an optical splitter and a reading interface,
 the optical splitter is configured to split light carrying the optical data in the optical-medium storage module into optical-medium data stored in the optical-medium storage module and read optical-medium data, and send the read optical-medium data to the reading interface; and
 the reading interface is configured to transmit the read optical-medium data to an external read interface connected to the reading interface.

5. The mechanism for optical-medium storage according to claim 1, wherein the optical-medium storage module is a torus structure, and a plurality of reflecting mirrors is arranged inside the torus structure to store the optical data inside the torus structure in a circulating manner.

6. An optical system for optical-medium storage, comprising:
 a plurality of mechanisms for optical-medium storage, each of the plurality of mechanisms is the mechanism according to claim 1;
 an encoding module for the plurality of mechanisms for optical-medium storage;
 a switching instruction acquisition module; and
 a switching instruction execution module;
 wherein the encoding module is configured to encode each of the plurality of mechanisms for optical-medium storage, to allocate a unique code to each of the plurality of mechanisms for optical-medium storage in the optical system;
 wherein the switching instruction acquisition module is configured to acquire a switching instruction inputted by a user, and the switching instruction comprises: a switching instruction for receiving the optical data that comprises the unique code of one of the plurality of mechanisms, a switching instruction for reading the optical data that comprises the unique code of one of the plurality of mechanisms, or a switching instruction for storing the optical data that comprises the unique code of one of the plurality of mechanisms; and
 wherein the switching instruction execution module is configured to send a switching operation instruction, according to the switching instruction acquired by the switching instruction acquisition module, to the instruction acquisition module of the one of the plurality of mechanisms for optical-medium storage that corresponds to the unique code comprised in the switching instruction.

7. The optical system for optical-medium storage according to claim 6, wherein, the optical-medium receiving module comprises a receiving interface, a receiving reflector and a receiving transmitter, wherein:
 the receiving interface is connected to an external interface;
 the receiving reflector is configured to reflect light carrying the optical data, which is received by the receiving interface, to the receiving transmitter; and
 the receiving transmitter is connected to the optical-medium input-output end, and is configured to transmit the light carrying the optical data which is reflected by the receiving reflector, to the optical-medium storage module.

8. The optical system for optical-medium storage according to claim 6, wherein, the optical-medium storing module comprises an optical transmission part, and the optical transmission part is configured to cooperate with the optical-medium input-output end to transmit the optical data.

9. The optical system for optical-medium storage according to claim 6, wherein:
 the optical-medium reading module comprises an optical splitter and a reading interface,
 the optical splitter is configured to split light carrying the optical data in the optical-medium storage module into optical-medium data stored in the optical-medium storage module and read optical-medium data, and send the read optical-medium data to the reading interface; and the reading interface is configured to transmit the read optical-medium data to an external read interface connected to the reading interface.

10. The optical system for optical-medium storage according to claim 6, wherein the optical-medium storage module is a torus structure, and a plurality of reflecting mirrors is arranged inside the torus structure to store the optical data inside the torus structure in a circulating manner.

11. A mechanism for optical-medium storage, comprising an optical-medium storage device and an optical-medium transmission device, wherein:

the optical-medium storage device comprises an optical-medium storage module and an optical-medium input-output end, the optical-medium storage module is configured to store an optical data, and the optical-medium input-output end is configured to receive and transmit the optical data to the optical-medium storage module and read the optical data stored in the optical-medium storage module;

the optical-medium transmission device is arranged at the optical-medium input-output end, the optical-medium transmission device comprises an optical-medium receiving module, an optical-medium storing module, and an optical-medium reading module;

the optical-medium receiving module is configured to receive the optical data transmitted from outside and transmit the optical data to the optical-medium storage module via the optical-medium input-output end, according to a receiving instruction;

the optical-medium storing module is configured to cooperate with the optical-medium storage module, and form a storage path for the optical data with the optical-medium storage module;

the optical-medium reading module is configured to provide an interface for reading and read the optical data stored in the optical-medium storage module, according to a reading instruction;

the optical-medium reading module comprises an optical splitter and a reading interface, the optical splitter is configured to split light carrying the optical data in the optical-medium storage module into optical-medium data stored in the optical-medium storage module and read optical-medium data, and send the read optical-medium data to the reading interface; and the reading interface is configured to transmit the read optical-medium data to an external read interface connected to the reading interface.

12. A mechanism for optical-medium storage, comprising an optical-medium storage device and an optical-medium transmission device, wherein:

the optical-medium storage device comprises an optical-medium storage module and an optical-medium input-output end, the optical-medium storage module is configured to store an optical data, and the optical-medium input-output end is configured to receive and transmit the optical data to the optical-medium storage module and read the optical data stored in the optical-medium storage module;

the optical-medium transmission device is arranged at the optical-medium input-output end, the optical-medium transmission device comprises an optical-medium receiving module, an optical-medium storing module, and an optical-medium reading module;

the optical-medium receiving module is configured to receive the optical data transmitted from outside and transmit the optical data to the optical-medium storage module via the optical-medium input-output end, according to a receiving instruction;

the optical-medium storing module is configured to cooperate with the optical-medium storage module, and form a storage path for the optical data with the optical-medium storage module;

the optical-medium reading module is configured to provide an interface for reading and read the optical data stored in the optical-medium storage module, according to a reading instruction; and the optical-medium storage module is a torus structure, and a plurality of reflecting mirrors is arranged inside the torus structure to store the optical data inside the torus structure in a circulating manner.

* * * * *